(12) United States Patent
Stauffenegger et al.

(10) Patent No.: US 8,153,084 B2
(45) Date of Patent: Apr. 10, 2012

(54) REDUCTION IN EDDY CURRENT LOSSES IN ELECTRICALLY CONDUCTING SAMPLE MATERIALS WITH THE ASSISTANCE OF SPECIAL NMR SAMPLE TUBES

(75) Inventors: Philippe Stauffenegger, Duebendorf (CH); Oskar Schett, Uster (CH)

(73) Assignee: Bruker BioSpin AG, Faellanden (DE)

( * ) Notice: Subject to any disclaimer, the term of this patent is extended or adjusted under 35 U.S.C. 154(b) by 983 days.

(21) Appl. No.: 11/603,882

(22) Filed: Nov. 24, 2006

(65) Prior Publication Data

US 2007/0128086 A1    Jun. 7, 2007

(30) Foreign Application Priority Data

Dec. 6, 2005   (DE) .................. 10 2005 058 195

(51) Int. Cl.
*B01L 3/00*     (2006.01)
*B01L 99/00*    (2010.01)
*G01V 3/00*     (2006.01)

(52) U.S. Cl. ......... 422/501; 422/500; 422/502; 324/321

(58) Field of Classification Search .................. 422/101, 422/102
See application file for complete search history.

(56) References Cited

U.S. PATENT DOCUMENTS

| | | | |
|---|---|---|---|
| 4,365,199 A * | 12/1982 | McNair | 324/318 |
| 5,302,900 A * | 4/1994 | Cummings | 324/321 |
| 5,552,709 A | 9/1996 | Anderson | |
| 6,466,019 B2 | 10/2002 | Marek | |
| 6,773,675 B2 * | 8/2004 | Cocola et al. | 422/549 |
| 6,917,201 B2 | 7/2005 | De Swiet | |
| 2005/0017720 A1 | 1/2005 | Mett | |

FOREIGN PATENT DOCUMENTS

DE      198 39 497      3/2000

OTHER PUBLICATIONS

Thomas M. De Swiet "Optimal electric fields for different sample shapes in high resolution NMR spectroscopy". Journal of Magnetic Resonance 174 (2005) 331-334.

* cited by examiner

*Primary Examiner* — Jill Warden
*Assistant Examiner* — Bryan Kilpatrick
(74) *Attorney, Agent, or Firm* — Paul Vincent

(57) ABSTRACT

A sample tube for an NMR probe head, which extends along a z axis and has an internal cavity that extends in an axial direction of the z axis, is open to the outside at the axially upper end, is closed at the axially lower end and contains a liquid NMR sample substance during operation, wherein the cross-sectional surface of this cavity extending perpendicularly to the z axis and parallel to the xy coordinate plane has an elongated shape in the direction of the x axis with maximum dimensions a in the y direction and b in the x direction, wherein a<b, is characterized in that the cross-sectional surface of the sample tube, which extends perpendicularly to the z axis and is parallel to the xy coordinate plane has a circular outer shape. Sample tubes of this type provide a particularly large signal-to-noise ratio, can be easily inserted into a conventional cryogenic probe head and be axially and radially positioned therein by existing precision centering devices.

9 Claims, 5 Drawing Sheets

PRIOR ART

REDUCTION IN EDDY CURRENT LOSSES IN ELECTRICALLY CONDUCTING SAMPLE MATERIALS WITH THE ASSISTANCE OF SPECIAL NMR SAMPLE TUBES

This application claims Paris Convention priority of DE 10 2005 058 195.1 filed Dec. 6, 2005 the complete disclosure of which is hereby incorporated by reference.

BACKGROUND OF THE INVENTION

The invention concerns a sample tube for an NMR (nuclear magnetic resonance) probe head, which extends along a z-axis and has an internal cavity that extends axially in the direction of the z-axis, is open to the outside at its axially upper end, is closed at its axially lower end, and which contains a liquid NMR sample substance during operation, wherein the cross-sectional surface of this cavity, which extends perpendicularly to the z-axis and is parallel to the xy coordinate plane has a shape which is elongated in the direction of the x-axis and has maximum dimensions a in the y-direction and b in the x-direction, wherein a<b.

A sample tube of this type is disclosed e.g. in U.S. Pat. No. 6,917,201 B2.

The detection system of an NMR spectrometer consists of the NMR resonator and the sample tube which is located inside the NMR resonator and contains the sample substance to be measured. When the sample substance is an electrically conducting solution, e.g. a salt solution, it influences optimum function of the NMR resonator, i.a. deteriorates the signal-to-noise ratio (SINO) of the NMR receiver system. The SINO, however, is one of the most important parameters of an NMR spectrometer, and for this reason, there is great interest in finding solutions to this problem.

The NMR resonator generates the radio frequency field impulses (RF pulses) for exciting the magnetic spins within the sample substance, and also receives the FID signal, which is emitted by the excited spins, with minimum noise.

The RF pulses generate eddy currents in the electrically conducting sample substance, which produce eddy current losses and deteriorate the quality (Q value) of the NMR resonator loaded in this fashion. This effect is particularly noticeable in cryogenically cooled resonators which usually have very high Q values of more than 3000 in the unloaded state. It can be demonstrated that with a salt concentration of more than approximately 200 mMolar, the Q value of these NMR resonators in the loaded state is practically only determined by the eddy current losses in the sample substance. Due to the deteriorated Q value, more RF energy must be guided into the detection system, since the losses in the sample substance must also be accommodated.

During transmission, the field (B1 field) which is irradiated by the NMR resonator into the sample substance in the form of pulses, causes spatial rotation of the magnetic spins through a desired angle (flip angle). The flip angle is proportional to the product of the field amplitude of the $B_1$ field pulse multiplied by the time duration of the B1 field pulse. With a given transmitter pulse power, the generated field amplitude and therefore also the flip angle are smaller due to the deteriorated Q value of the RF resonator. In order to return to the desired flip angle, either the pulse power of the transmitter must be increased or the time duration of the RF pulse must be extended.

During reception, the excited magnetic spins behave like small RF transmitters which irradiate an RF signal, i.e. the FID signal. This also causes lossy eddy currents in the conducting sample substance, such that additional noise is superposed on the FID signal and the SINO is deteriorated.

It must also be noted that when cryogenically cooled probe heads (cryogenic probe heads) are used, temperature gradients may occur within the sample substance, which usually have a disturbing effect on the quality of the NMR spectrum. Cryogenic probe heads have a double-walled Dewar with an intermediate vacuum insulation and an inner bore at room temperature (approximately 295 K) into which the sample tube is inserted. The NMR resonator is in the thermally insulated space which is cooled to a temperature of approximately 15 K. There is consequently a temperature difference of approximately 280 K between the sample tube and the NMR resonator with the consequence that the sample tube radiates a large amount of heat into the cryogenically cooled space of the Dewar. The sample tube must therefore be permanently heated by air which flows in the narrow space between the sample tube and the Dewar wall. The gap must be very narrow, so that the sample tube yields maximum volume and a maximum fill factor relative to the NMR resonator, since both increase the SINO. The intermediate space must also be very constant to provide uniform heating of the entire surface of the sample tube for avoiding disturbing temperature gradients in the sample substance. This object is achieved by exact axial and radial positioning of the sample tube relative to the Dewar wall which can be obtained e.g. using centering springs in the lower region of the sample tube [3].

Calculations [1,2] have shown that when the losses in the NMR resonator are negligible compared to the eddy current losses of the sample substance, the cross-sectional surface of the sample substance can be reduced to a certain degree without thereby deteriorating the SINO. This is due to the fact that the noise signal of the eddy currents and also the FID signal of the spins originate from the same source, i.e. the sample substance, and therefore decrease at the same rate and do not change the SINO value. The transmission path of both signals to the NMR resonator is also the same, such that their amplitudes and phases are identically changed and the SINO also remains the same. Only the amplitudes of the two signals which are received by the NMR resonator change, i.e. decrease.

The SINO is maintained only up to a certain reduction of the cross-sectional surface, from which the losses in the NMR resonator become more and more dominant compared to the eddy current losses. The main part of the noise signal is then generated in the NMR resonator itself, does not depend on the sample substance and has not passed through a transmission path. The FID signal, however, is weaker since the cross-sectional surface and thereby also the volume of the sample substance have decreased and also since it must pass through the transmission path to the NMR resonator. In both cases, the FID signal in the NMR resonator is weaker, and therefore the SINO is worse.

The SINO can be improved by selecting a non-circular cross-sectional surface shape of the sample substance, which produces minimum eddy current losses. Calculations and experiments have shown [1,2] that the cross-sectional surface must be elongated, e.g. be rectangular or elliptical, and the elongated dimension of the cross-sectional surface must be aligned parallel to the direction of the B1 field.

In this case, two variables must be correctly selected or set at the same time, i.e. firstly the shape of the cross-sectional surface of the sample substance, and secondly the orientation of the longer axis of the cross-sectional surface which must be parallel to the B1 field. A sample tube which rotates about its axis as in conventional high-resolution NMR spectroscopy is thereby clearly no longer possible. However, this fact entails no noticeable disadvantages for currently available shim systems, since salt-containing sample substances do not provide maximum resolution.

The rectangular and elliptical cross-sectional shapes are shapes having a transverse and a longitudinal dimension a and b, wherein a<b. The question is now, whether an optimum ratio $(a/b)_{opt}$ exists which produces the maximum SINO, and if this is the case, on which further variables does it depend.

We start with a square cross-sectional shape of a cross-sectional surface $q=a \cdot b=s^2$, wherein s is the side length of the square. The ratios are similar to those of the round cross-sectional shape described above, i.e. with decreasing q, the SINO remains constant up to a minimum value of $q=q_{min}$ which occurs when the losses in the NMR resonator slowly show, and the SINO starts to decrease. This tolerance for q may be used to reduce the eddy current losses by choosing an optimum ratio (a/b).

The value for a must be minimum to thereby also minimize the eddy current losses. The reason therefor is the outline surface of the sample substance facing and being irradiated by the B1 field. When the value a decreases, this outline surface becomes smaller and smaller so that smaller eddy currents are induced, thereby also producing smaller noise components, which has a positive effect on the SINO.

With decreasing a, the cross-sectional surface of the sample substance also constantly decreases for a given value for b, until the minimum cross-sectional surface $q_{min}$ has been reached. In order to further reduce a, b must be enlarged. This is possible only until b has reached its maximum value $b=b_{max}$ which is the case when b is limited by the diameter of the RT bore of the Dewar. This produces the following values for optimum dimensions of the cross-sectional surface:

$$b=b_{max}$$

$$a=q_{min}/b_{max}$$

$$(a/b)_{opt}=q_{min}/(b_{max})^2$$

Since the eddy current losses also depend on the concentration of the salt solution, the value for $q_{min}$ is different for each salt solution concentration value, i.e. when the salt concentration is larger, $q_{min}$ is smaller and vice versa, when it is smaller, $q_{min}$ is larger. This means that with increasing salt concentration, the optimum a, and thereby also the optimum side ratio or axial ratio a/bmax decrease more and more, such that the cross-sectional surface assumes a shape which continuously increases in length.

This is, however, problematic in that sample tubes formed in this fashion no longer fit into the conventional, standard receiving openings for the samples of NMR spectrometers. For this reason, it is the underlying purpose of the invention to provide a sample tube for an NMR probe head which has all above-mentioned advantages of geometrically optimizing the cross-sectional surfaces to considerably improve the SINO, wherein, however, the sample tube can be easily and exactly introduced into a standard receiving opening and centering devices of conventional probe heads of NMR spectrometers and must be easily realized with simple technical means.

SUMMARY OF THE INVENTION

This object is achieved in a surprisingly simple but effective fashion in accordance with the invention by an NMR sample tube of the above-mentioned type which is characterized in that the cross-sectional surface of the sample tube which extends perpendicularly to the z axis and is parallel to the xy coordinate plane has a circular outer shape.

The inventive sample tube differs from the conventional sample tubes described in [2] (FIGS. 1 and 2) which have a nearly constant wall thickness about their entire periphery. The inventive sample tubes have a cylindrical outer surface, i.e. the outer cross-sectional shape is circular as in conventional sample tubes, but the inner cross-sectional shape is approximately rectangular. The wall thickness of these inventive sample tubes therefore greatly varies about the periphery.

These sample tubes are advantageous in that they can be inserted into a conventional cryogenic probe head and can be axially and radially positioned therein using the existing precision centering device. The sample holder holding the sample tube at its upper end is also a conventional sample holder. In other words, whether the sample tube sample substance has a circular or rectangular shape—the probe head remains unchanged.

This facilitates handling by the user during experiments, since the user does not need to change the probe head each time when changing from a round to a rectangular shape, and moreover, acquisition of a new probe head is not necessary, since the existing one can be used both for round sample tubes and for rectangular sample tubes without any disadvantages.

In simple embodiments of the inventive sample tube, the cavity is elongated in the direction of the x axis along the overall axial length L of the sample tube with maximum dimensions a in the y direction and b in the x direction, wherein a<b.

Alternatively, the cavity may be elongated in the direction of the x axis only over a partial section $L_z$ which is less than the overall length L of the sample tube, having maximum dimensions a in the y direction and b in the x direction, wherein a<b.

Advantageous further developments of this embodiment are characterized in that the cavity has a circular cross-sectional surface and contains two precision shells of a length $L_z$ which are connected to the inner wall of the cavity and are positioned as exactly diametrically opposite to each other as possible, wherein each of the two precision shells has a shape which is defined along the length $L_z$ through two surfaces closing over the periphery, i.e. a first cylindrical surface which has as exactly the same curvature as possible as that of the cavity of the sample tube, and a second surface which is completely flat and extends parallel to the axis of the first cylindrical surface, wherein the two flat surfaces of the two precision shells are parallel to each other and define an approximately rectangular cavity which is completely or partially filled with a sample substance during operation.

This can be achieved in a particularly simple fashion in that the connection between the two precision shells and the circular cross-sectional surface of the cavity is produced through melting.

The lower end of the two precision shells may advantageously be rigidly connected to a round disk to prevent sample substance from entering into the space below the disk.

In preferred embodiments of the inventive sample tube, the starting material for producing the sample tube is glass, or a glass compound such as e.g. pyrex, or quartz glass.

In particularly advantageous embodiments, the upper and lower end of the sample substance located in the sample tube during operation is closed by one susceptibility insert each, whose material has a magnetic susceptibility value which is approximately equal to that of the sample substance.

This can be further improved in further developments in that the positions of the susceptibility inserts relative to the sample tube are selected such that the sample substance is centered in the maximum field region of the B1 field during the measuring process.

The present invention also includes a susceptibility insert for a sample tube of the above-described inventive type. The susceptibility insert is thereby advantageously produced from a material which is suited for sample substances with aqueous solvents, e.g. "PPS" (p-phenylene sulfide) or "ULTEM" (p-etherimide).

In other advantageous further developments, the susceptibility insert may have a length of one to two times the outer diameter of the sample tube and fit into the cross-section of the cavity with a play of preferably 10 μm.

The susceptibility insert for a sample tube of the inventive type may also have an axially extending thread at one end, into which an assembly bar can be screwed in and out, wherein this assembly bar may be produced e.g. from "TEFLON" or "POM".

Further advantages of the invention can be extracted from the description and the drawings. The features mentioned above and below may be used individually or collectively in arbitrary combination. The embodiments shown and described are not to be understood as exhaustive enumeration but have exemplary character for describing the invention.

The invention is shown and described in more detail in the drawing.

DESCRIPTION OF THE PREFERRED EMBODIMENT

Figure 1:
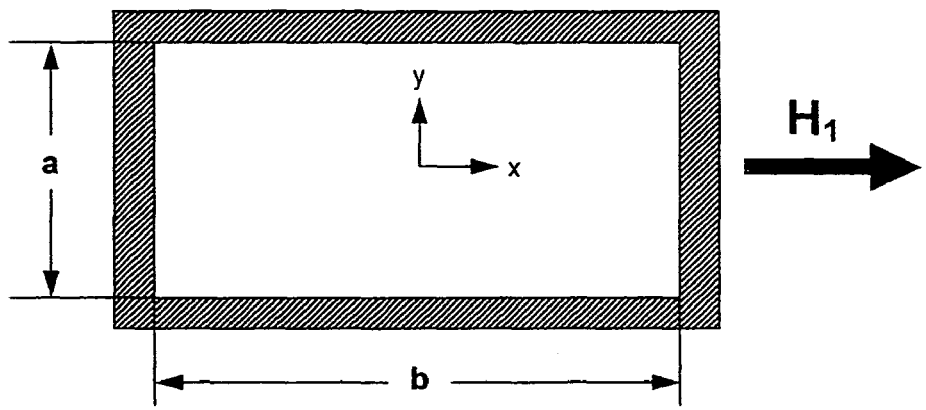
FIG. 1 shows a schematic cross-section through a rectangular sample tube in accordance with prior art.
Figure 2:
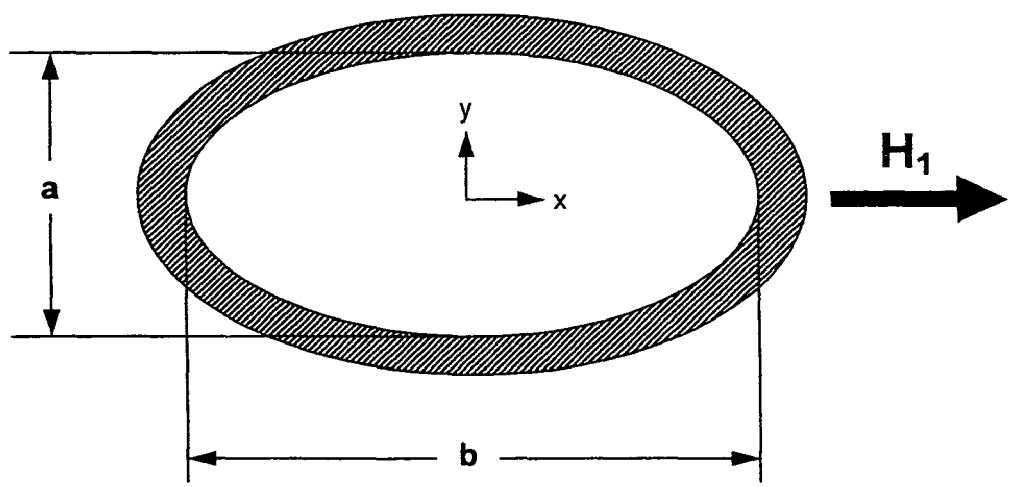
FIG. 2 shows a cross-section through an elliptical sample tube in accordance with prior art.
Figure 3:
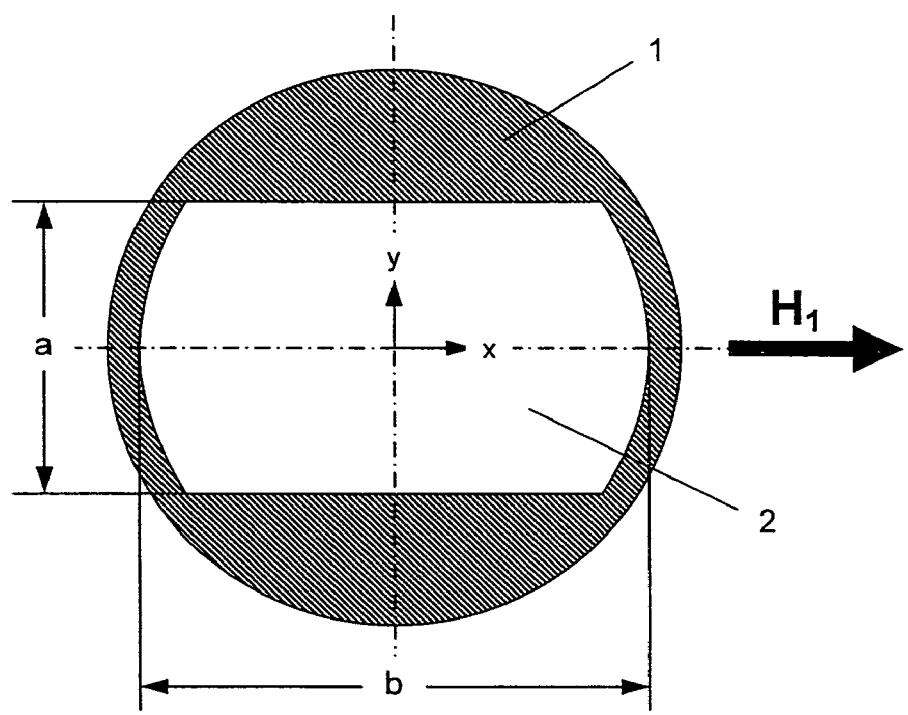
FIG. 3 shows a cross-section through an inventive sample tube with nearly rectangular inner cross-section, produced through drawing.
Figure 5:
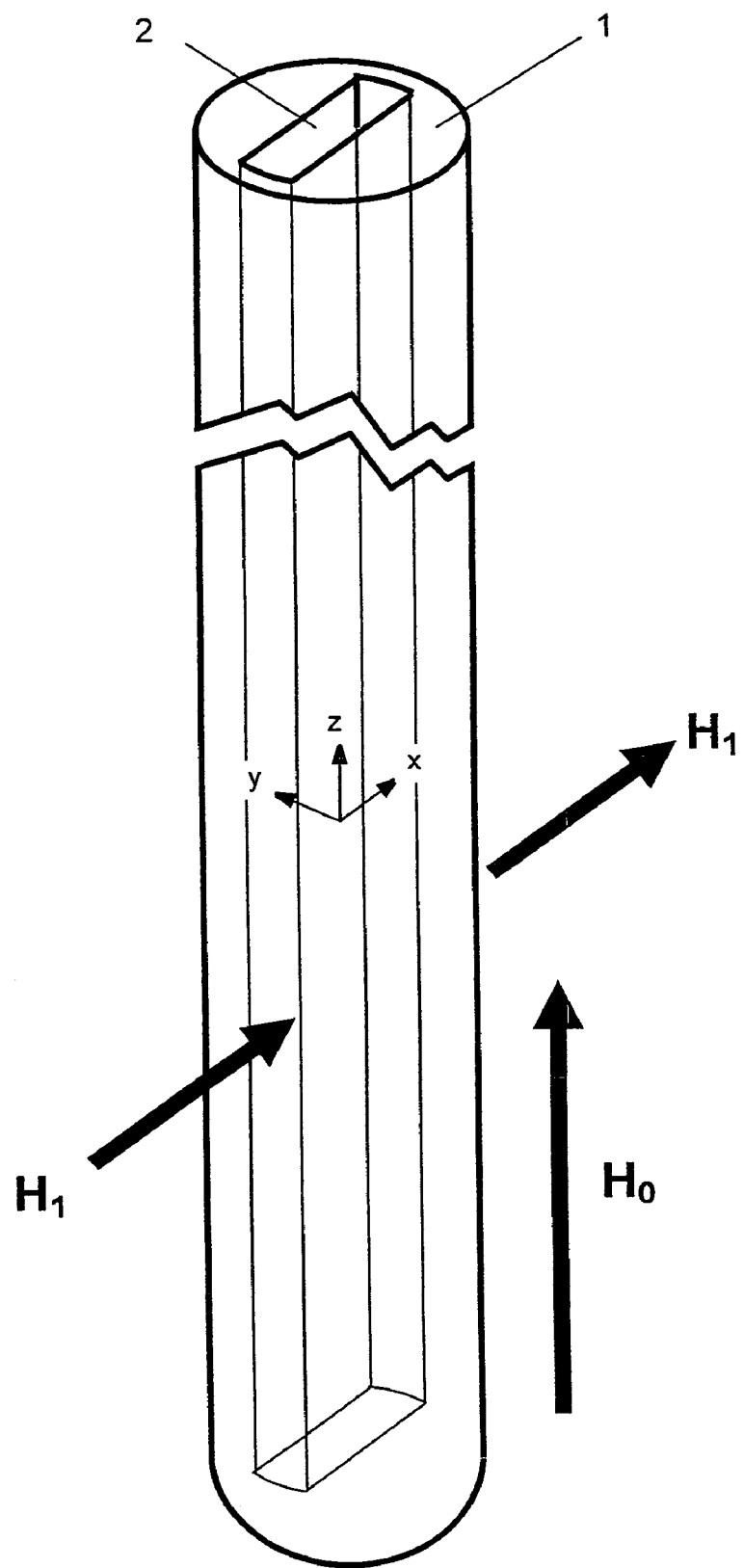
FIG. 5 shows a schematic spatial view of a sample tube in accordance with FIG. 3.

The inventive sample tubes of glass can be produced with relatively simple technical means, wherein two production methods are explained in more detail. The first method utilizes a rectangular drawing tool for producing the rectangular interior space of the sample tube in a cylindrical glass body by a drawing process. The cylindrical glass body advantageously has an axially extending round bore having a diameter which is slightly smaller than the smaller dimension b of the desired rectangle. The round bore serves as a guidance for the rectangular drawing tool. FIGS. 3 and 5 shows such sample tubes. The approximately rectangular interior space 2 is inside the sample tube 1.

The second production method is advantageous in that no drawing tools are required. It is therefore particularly suited for small series production or production of individual examples. It requires firstly, a conventional round sample tube 3, preferably produced from glass and having a cavity with a circular cross-sectional surface, and secondly two precision shells 4 and 5 of a length $L_z$ which are also preferably produced from glass, connected to the inner wall of the cavity and positioned as exactly diametrally opposite to each other as possible, wherein each of the two precision shells has a shape which is defined along the length $L_z$ by two surfaces subtending the periphery, i.e. a first cylindrical surface preferably having exactly the same curvature as that of the cavity of the sample tube, and a second surface which is completely flat and extends parallel to the axis of the first cylindrical surface, wherein the two flat surfaces of the two precision shells are parallel to each other and define an approximately rectangular cavity which is completely or partially filled with the sample substance.

Figure 4:
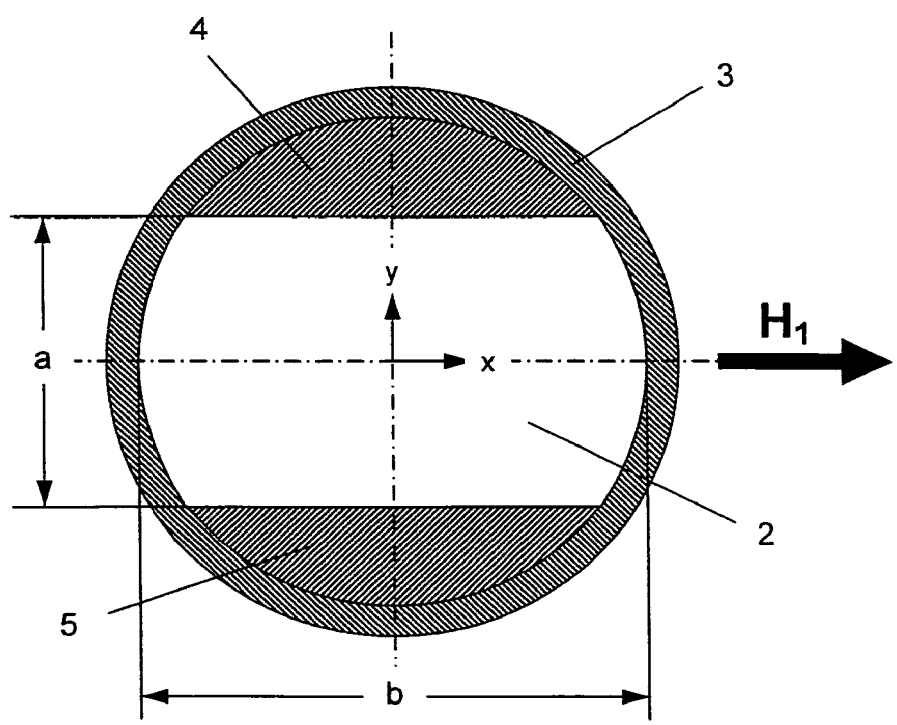
FIG. 4 shows a cross-section through an inventive sample tube with almost rectangular inner cross-section, produced using two precision shells.
Figure 6:
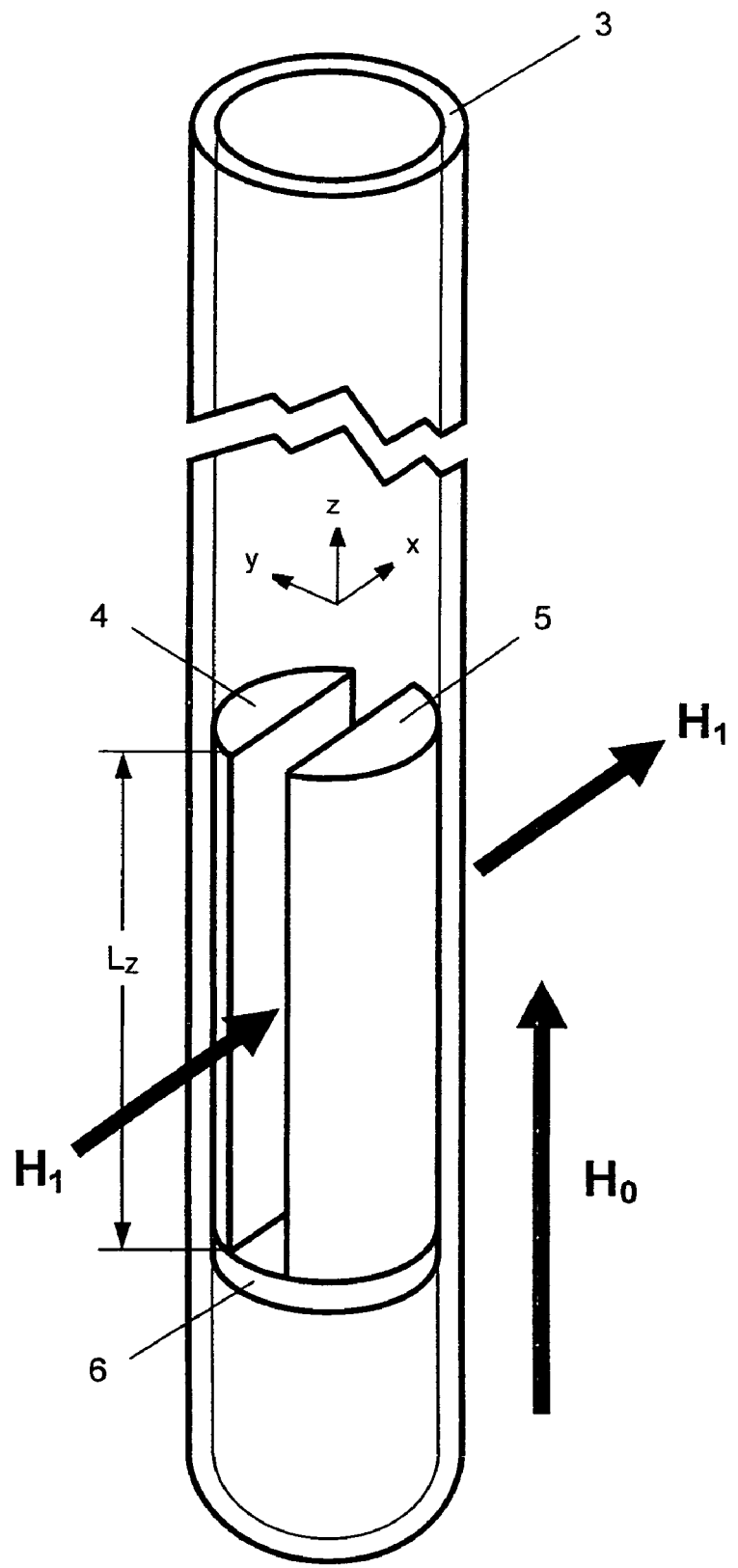
FIG. 6 shows a perspective view of a sample tube according to FIG. 4, wherein a terminating disk is mounted to the lower edge of the two precision shells.

The two precision shells which may have e.g. a length $L_z$ of approximately 60 mm for a sample tube having an outer diameter of approximately 5 mm, are pressed diametrally relative to each other against the inner wall of the circular bore, and the contact surfaces are melted to each other through subsequent heating to an exactly defined temperature (FIG. 4 and FIG. 6). The temperature must be sufficiently low to prevent deformation of the sample tube and the two precision shells, but sufficiently high to ensure melting at the contact surfaces. It is very important that the melting process occurs over the entire contact surface to prevent sample substance from entering into the critical region between the contact surfaces. This region produces increased eddy current losses and would substantially reduce the SINO improvement.

Any solvent may be used, since the precision shells are made from an inert material, e.g. glass. The entire sample tube can be repeatedly used, since it can be cleaned.

By mounting a disk 6 below the two precision shells (FIG. 6), the amount of sample substance can be limited, which is advantageous, in particular, when the substance is very expensive. This disk moreover also prevents sample substance from getting into the lower area, in particular, into the lower curve of the sample tube which may improve the quality of the NMR spectrum ("water hump" and "splitting") and increase the sensitivity.

The fill level of the sample substance must normally be 2.5 to 4 times the active height of the sample substance. The active height is defined by the region in the z-direction of the sample substance which is irradiated by the RF resonator and excites the magnetic spins. There is practically no excitation beyond this region, and one could be tempted to select a sample substance fill level which corresponds approximately to this active height, which would be desired, in particular, for very expensive sample substances. This would, however, entail considerable disadvantages since both ends of the sample substance have abrupt susceptibility changes which are generated by the different magnetic susceptibility values of the sample substance and the bordering medium (e.g. air, glass), which would cause inhomogeneities of the B0 field and thereby deterioration of the NMR spectrum.

Figure 7:
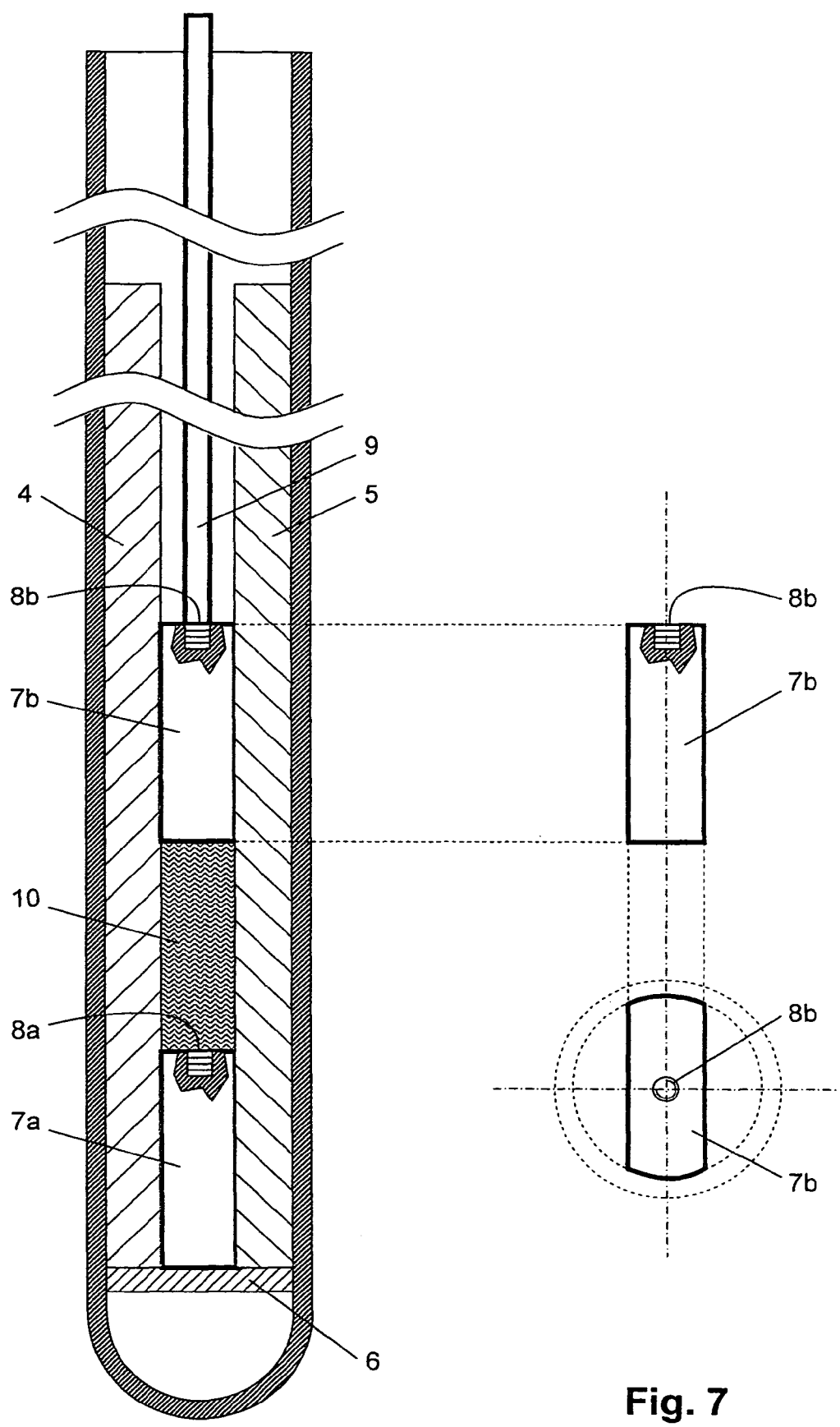
FIG. 7 shows a cross-section through an inventive sample tube, wherein the height of the sample substance is limited by two susceptibility inserts.

This problem is solved by inserting so-called susceptibility inserts (SZ inserts) 7a and 7b at both ends of the sample substance (FIG. 7), wherein the magnetic susceptibility value of these SZ inserts should be approximately equal to that of the sample substance. The abrupt susceptibility changes are thereby shifted to those ends of the SZ inserts which have the largest separation from the sample substance, such that the B0 inhomogeneities produced there are sufficiently far away as to not influence the NMR spectrum.

Since the sample substances have, in general, different susceptibilities, a sufficient number of SZ inserts with different susceptibilities must be provided. The sample substances used for sample tubes with rectangular cavity predominantly contain aqueous solvents, such that the matching SZ inserts can be produced e.g. from "PPS" (p-phenylene sulphide) or "ULTEM" (p-etherimide).

The SZ inserts 7a, 7b each have a threaded hole 8a, 8b into which an assembly bar 9, which has a thread at one end, can be screwed. The two SZ inserts can be inserted and positioned in the rectangular cavity of the sample tube using this assembly bar which may be produced e.g. from "TEFLON" or "POM". At first, the lower SZ insert 7a is mounted and the assembly bar is subsequently unscrewed and the sample substance filled in. The upper SZ insert 7b is then mounted and the assembly bar is removed again.

A play of e.g. 10 μm between the SZ insert and the inner wall of the cavity is sufficient in order to permit air located in the cavity of the sample tube to escape.

The length of the SZ insert should preferably be one to two times the outer diameter of the sample tube.

The positions of the two SZ inserts relative to the sample tube are selected such that the sample substance 10 is centered in the maximum field area of the B1 field during measurement.

A further advantage shows upon closer examination of the rectangular cross-sectional shapes of the inventive sample tubes in FIGS. 3 and 4. These are not exactly rectangular but are round at both ends of the longer dimension b. These curves are clearly advantageous, in particular, for weak salt solution concentrations, where the optimum cross-sectional shape approaches the square shape, since the average value for $b_{max}$ is considerably larger than for a simple rectangular shape. A larger $b_{max}$, however, produces a smaller optimum value for a and therefore smaller eddy current losses.

| List of Reference Numerals | |
|---|---|
| 1 | sample tube produced through drawing |
| 2 | rectangular cavity of the sample tube |
| 3 | sample tube with the two inserted precision shells 4 and 5 |
| 4, 5 | precision shells which are inserted into the sample tube 3 |
| 6 | disk for closing the lower end of the precision shells |
| 7a, 7b | susceptibility inserts (SZ inserts) |
| 8a, 8b | threaded bores in the susceptibility inserts for mounting the assembly bar 9 |
| 9 | assembly bar for insertion and removal of the susceptibility inserts 7a and 7b |
| 10 | sample substance with minimized volume |

LIST OF REFERENCES

[1] Th. De Swiet, Optimal electric fields for different sample shapes in high resolution NMR spectroscopy, JMR 174 (2005) 331-334
[2] U.S. Pat. No. 6,917,201 B2
  "Squashed liquid NMR sample tubes and RF coils"
[3] Patent DE 100 06 324 C1
  "Gekühlter NMR-Probenkopf mit Vorrichtung zur Zentrierung der Messproben"

We claim:

1. A sample tube for holding a liquid NMR sample substance in an NMR probe head, the sample tube extending along a z axis and having an internal cavity that extends axially in a direction of the z axis, said internal cavity being open at an axially upper end thereof, and closed at an axially lower end thereof, wherein a cross-sectional surface of said cavity, which extends perpendicularly to the z axis and is parallel to an xy coordinate plane, has an elongated shape in a direction of an x axis and has maximum dimensions a in the y direction and b in the x direction, wherein a<b, a cross-section of an outer surface of the sample tube, which extends perpendicularly to the z axis and parallel to the xy coordinate plane having a circular shape, wherein said cavity has said elongated shape along the x axis only over a partial section $L_z$ which is smaller than an overall length L of the sample tube, wherein said cavity has a circular cross-sectional surface and contains two precision shells of length $L_z$ which are connected to an inner wall of the cavity and are preferentially positioned exactly diametrically opposite to each other, wherein each of the two precision shells has a shape which is defined along the length $L_z$ by two surfaces subtending a periphery, namely a first cylindrical surface which preferentially has exactly the same curvature as an inner wall of the sample tube, and a second surface which is completely flat and extends parallel to an axis of said cylindrical surface, wherein two flat surfaces of said two precision shells are parallel to each other and define an approximately rectangular cavity in which the sample substance is completely or partially filled, wherein lower ends of said two precision shells are solidly connected to a round disk to prevent sample substance from entering into a space below said disk.

2. The sample tube of claim 1, wherein connection between said two precision shells and a circular cross-sectional surface of said inner wall is obtained by melting.

3. The sample tube of claim 1, wherein a starting material for producing the sample tube is glass, a glass compound, pyrex, or quartz glass.

4. The sample tube of claim 1, wherein upper and lower ends of a sample substance located in the sample tube are each closed by one susceptibility insert whose material has a magnetic susceptibility value which is approximately equal to that of the sample substance.

5. The sample tube of claim 4, wherein positions of said susceptibility inserts relative to the sample tube are selected such that the sample substance is centered in the maximum field area of a B1 field during NMR measurement.

6. The susceptibility insert for the sample tube of claim 4, the susceptibility insert consisting essentially of a material which is suited for sample substances having aqueous solvents, "PPS" (p-phenylene sulfide), or "ULTEM" (p-etherimide).

7. The susceptibility insert for the sample tube of claim 4, wherein the susceptibility insert has a length of one to two times an outer diameter of the sample tube and fits in a cross-section of the sample tube with play or with play of approximately 10 μm.

8. The susceptibility insert for the sample tube of claim 4, the susceptibility insert having an axially extending thread at one end for screwed engagement with an assembly bar.

9. The susceptibility insert the sample tube of claim 8, wherein said assembly bar comprises "TEFLON" or "POM".

* * * * *